(12) United States Patent
Aizawa et al.

(10) Patent No.: US 7,180,164 B2
(45) Date of Patent: Feb. 20, 2007

(54) SEMICONDUCTOR DEVICE

(75) Inventors: Hidekuni Aizawa, Kanagawa (JP);
Hisataka Izawa, Kanagawa (JP);
Takehiko Matsuda, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/525,909

(22) PCT Filed: Aug. 26, 2003

(86) PCT No.: PCT/JP03/10778

§ 371 (c)(1),
(2), (4) Date: Feb. 25, 2005

(87) PCT Pub. No.: WO2004/027949

PCT Pub. Date: Apr. 1, 2004

(65) Prior Publication Data

US 2006/0006509 A1    Jan. 12, 2006

(30) Foreign Application Priority Data

Aug. 29, 2002 (JP) .............................. 2002-251306

(51) Int. Cl.
*H01L 23/02* (2006.01)
(52) U.S. Cl. ...................... 257/686; 257/666; 257/777; 257/787
(58) Field of Classification Search .............. 257/98, 257/99–100, 685–686, 723, 787, 666, 731, 257/773, 777, 786, 790
See application file for complete search history.

(56) References Cited

FOREIGN PATENT DOCUMENTS

| JP | 03-278565 | 12/1991 |
|----|-----------|---------|
| JP | 09-36300 | 2/1997 |
| JP | 2001-94028 | 4/2001 |
| JP | 2001-168122 | 6/2001 |
| JP | 2002-185021 | 6/2002 |

*Primary Examiner*—Hoai Pham
*Assistant Examiner*—Dilinh Nguyen
(74) *Attorney, Agent, or Firm*—Sonnenschein Nath & Rosenthal LLP (57) ABSTRACT

This is a semiconductor apparatus capable of realizing a sharing of parts without introducing enlargement of the apparatus and deterioration in reliability of the wire bonding in case of responding to various electronic circuits. It is a semiconductor laser apparatus configured to include a housing (1) in which device mounting portions (1A), (1B) are respectively formed on both one surface side and the other surface side thereof; a semiconductor laser device (1) mounted in the device mounting portion (1A) on one surface side of this housing; a photo-diode (11) mounted in the device mounting portion (1B) on the other surface side of the housing; and a plurality of leads (3), (4), (5), and (6) connected through wires (8) to either the semiconductor laser device (7) or the photo-diode (11), wherein the pad portions (5B) of the leads (5) are exposed to the device mounting portions (1A), (1B) in the position relation alternate with each other on the one surface side and the other surface side of the housing (1), so that the wire bonding to the pads (5B) of the leads (5) is properly performed from either one surface side or the other surface side of the housing (1) by setting this exposed portion as the connection portion of the wire bonding.

4 Claims, 7 Drawing Sheets

SEMICONDUCTOR DEVICE

The present invention relates to a semiconductor apparatus that uses a housing that is able to mount devices on one surface side and the other surface side.

Figure 5A:
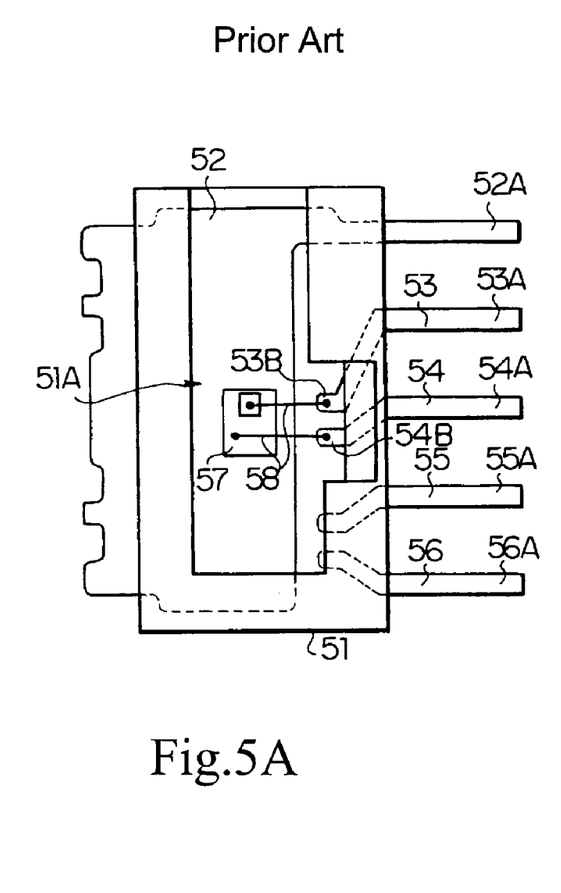
FIG. 5A to FIG. 5C are charts showing a configuration of a conventional semiconductor laser apparatus.
Figure 5B:
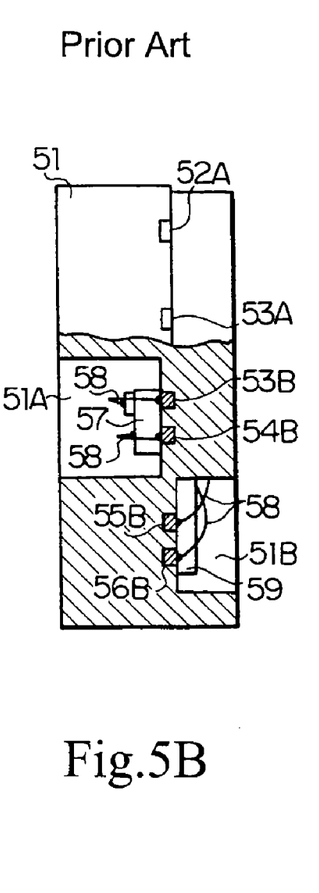
Figure 5C:
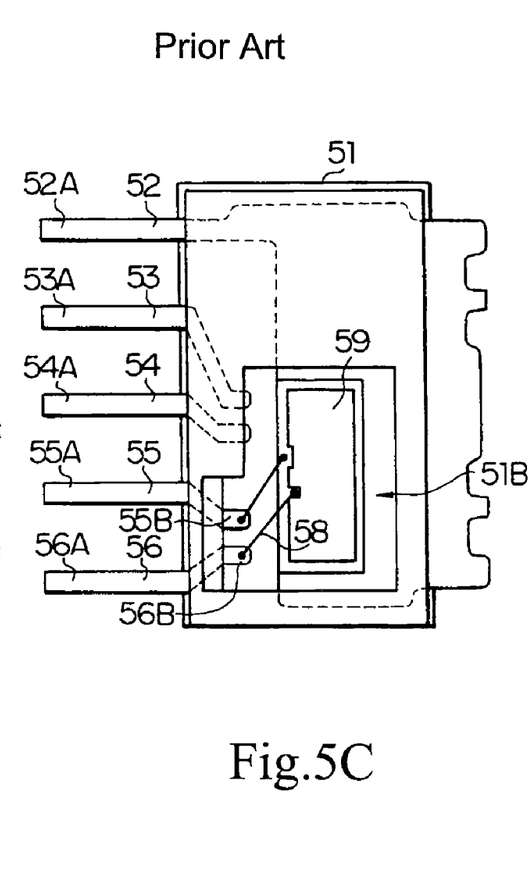

FIG. 5A to FIG. 5C show configurations of a conventional semiconductor laser apparatus, wherein FIG. 5A is a chart when the semiconductor laser apparatus is viewed from one direction, FIG. 5B is a side view including a partial fracture surface of the semiconductor laser apparatus, and FIG. 5C is a chart when the semiconductor laser apparatus is viewed from the other direction. The semiconductor laser apparatus in these figures is configured such that an insulating housing 51 is used as a base member. A plurality of (5 in the shown example) leads 52, 53, 54, 55 and 56 are fixed by adhesion to the housing 51, for example, by an insert molding. The respective leads 52 to 56 are electrically insulated from each other by the housing 51. Also, one end sides of the respective leads 52 to 56 are exposed to outside in the situation where it is protruding from the housing 51, and these protruded lead portions are formed as terminal portions 52A to 56A for connecting a drive circuit. Moreover, the other end portions of the other leads 53 to 56 except the lead 52 are formed as pad portions 53B to 56B for wire bonding.

Also, a concave device mounting portion 51A is formed on one surface side of the housing 51, and a semiconductor laser device 57 is mounted on the surface of the lead 52 and on the bottom of this concave device mounting portion 51A. This semiconductor laser device 57 is the semiconductor device called a LOP (Laser-Diode On Photo-Diode). The semiconductor laser device 57 is adhered to one surface of the lead 52 by using conductive paste. The semiconductor laser device 57 is also connected (wired) to the pad portions 53B, 54B of the leads 53 and 54 by the wire bonding using wires 58. Consequently, the semiconductor laser device 57 is not only electrically connected to the lead 52 by the conductive paste, but also electrically connected through the wires 58 to the leads 53 and 54.

On the other hand, a concave device mounting portion 51B is also formed on the other surface of the housing 51, and a photo-diode 59 is mounted on the surface of the lead 52 on the bottom of this device mounting portion 51B. This photo-diode 59 is adhered to the other surface (the surface opposite to the mounting surface of the semiconductor laser device 57) of the lead 52 by using insulating paste. Also, the photo-diode 59 is connected (wired) to the pad portions 55B and 56B of the leads 55 and 56 by the wire bonding using the wires 58. Consequently, the photo-diode 59 is electrically connected through the wires 58 to the leads 55 and 56.

The semiconductor laser apparatus having the above-mentioned configuration is, for example, used by assembling in a bar code reader. In that case, the semiconductor laser device 57 functions as a light emitting device for emitting the laser light to be irradiated to a bar code, and the photo-diode 59 functions as a light receiving device for receiving the return light from the bar code.

Figure 6A:
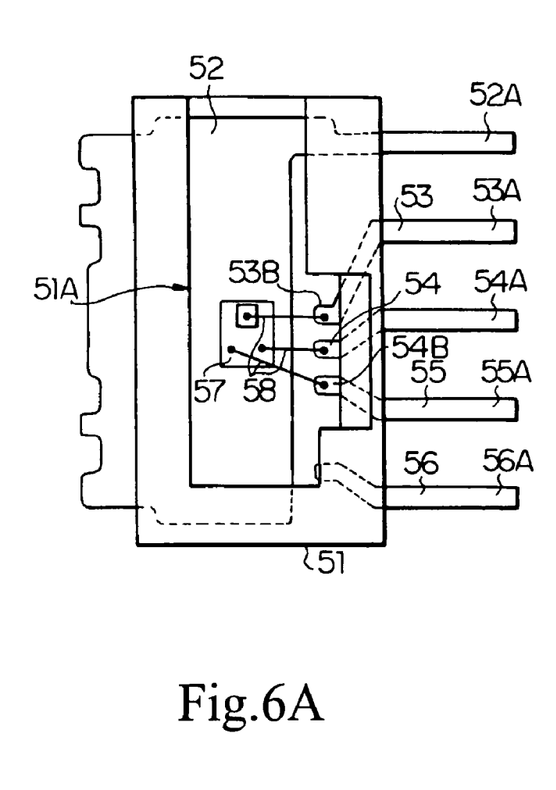
FIG. 6A to FIG. 6C are charts showing another configuration of the conventional semiconductor laser apparatus.
Figure 6B:
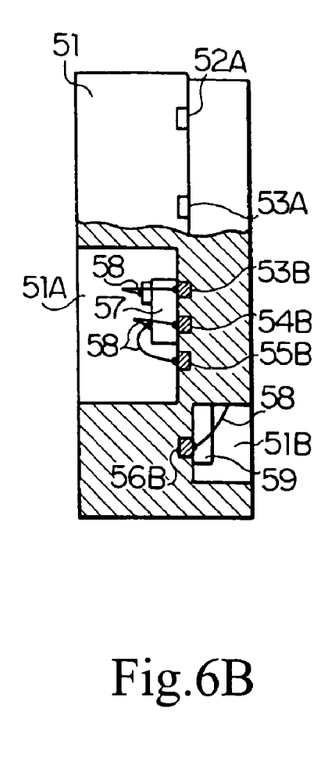
Figure 6C:
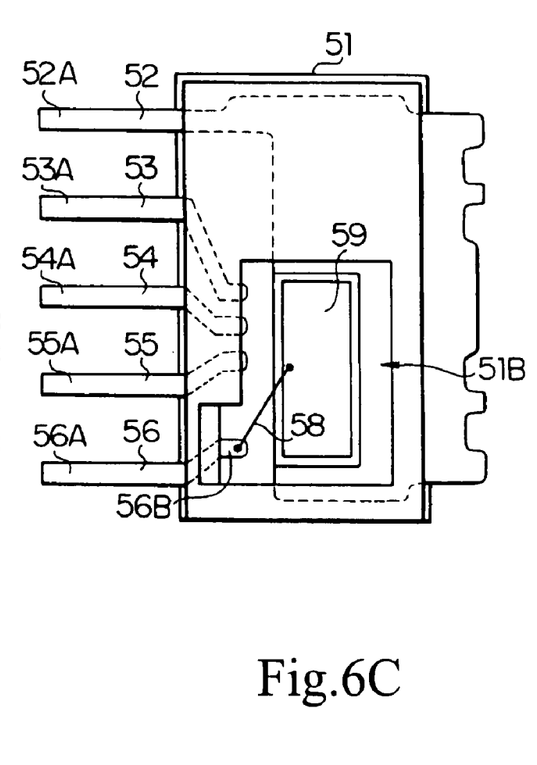

In this case, since the application field of the semiconductor laser apparatus is wide variety, the responses to various electric circuits are required. In that case, depending on the configuration of the electric circuits, it is may be considered that the corresponding relations between the semiconductor laser device 57 and the photo-diode 59, and the plurality of leads 52 to 56 corresponding to them are considered to be altered. Specifically, as shown in FIG. 6A to FIG. 6C, for example, the case may be considered wherein, on one surface side of the housing 51, the semiconductor laser device 57 and the leads 53, 54 and 55 are connected through the wires 58, respectively, and on the other hand, on the other surface side of the housing 51, the photo-diode 59 is mounted on the surface of the lead 52 by using the conductive paste, and this photo-diode 59 and the lead 56 are connected through the wires 58.

In this case, as compared with those shown previously in FIG. 5A to FIG. 5C, since the work surface of the wire bonding to the pad portion 55B of the lead 55 is changed from the other surface side of the housing 51 to one surface side, the lead 55 and housing 51 which correspond thereto need to be separately prepared. Thus, in the conventional semiconductor laser apparatus, in coping with the various electric circuits, it was difficult to perform sharing of parts.

Figure 7A:
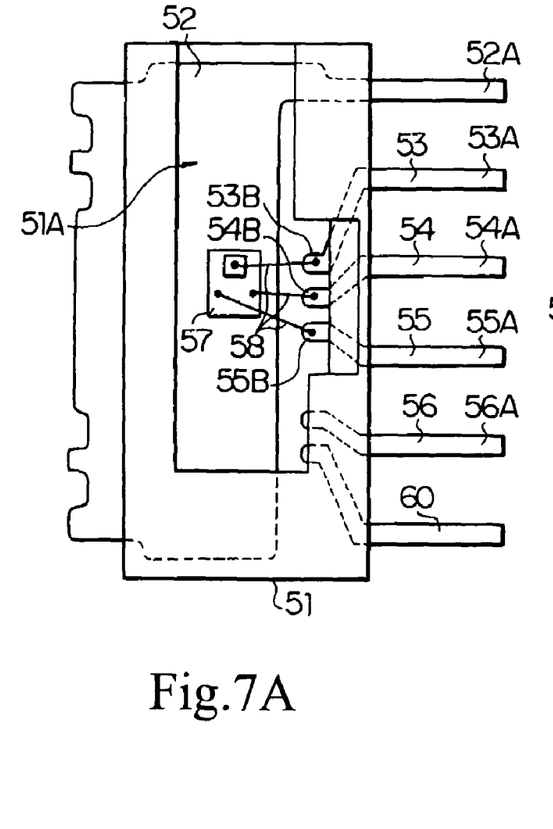
FIG. 7A to FIG. 7C are charts showing a configuration to perform sharing of parts in the conventional semiconductor laser apparatus.
Figure 7B:
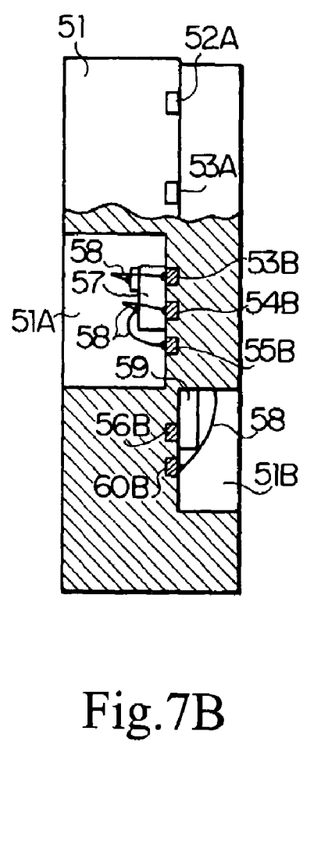
Figure 7C:
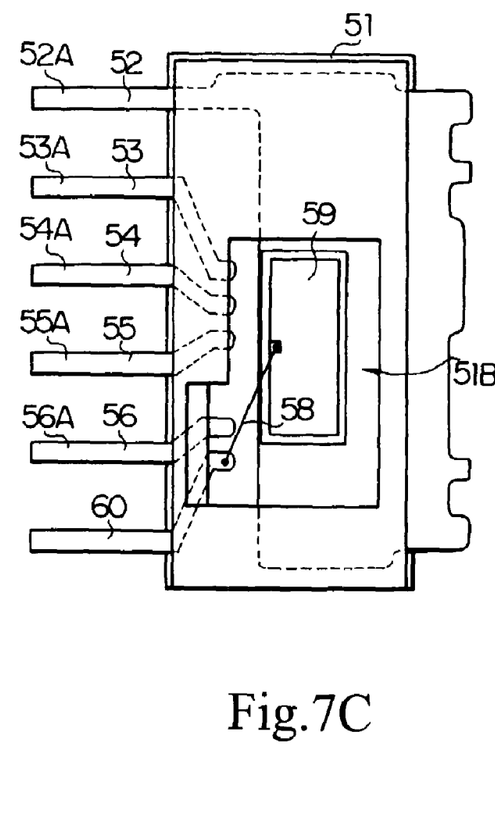

Also, as means for performing sharing of parts, for example, as shown in FIG. 7A to FIG. 7C, it is considered to add a lead 60. In this case, in response to the configuration of the electric circuit, for example, in addition to the mechanism in which as shown, the semiconductor laser device 57 is connected through the wires 58 to the leads 53, 54 and 55, the photo-diode 59 is also connected through the wire 58 to the lead 60 (pad portion 60B), and the lead 56 is consequently used as an empty lead (non-used lead), the mechanism that is not shown can be employed in which the semiconductor laser device 57 is connected through the wires 58 to the leads 53, 54, the photo-diode 59 is also connected through the wires 58 to the leads 56, 60, and the lead 55 is consequently used as the empty lead. However, since each pitch between the terminals of the leads is determined by a rule, the addition of the lead 60 calls on the larger scale of the semiconductor laser apparatus.

Figure 8A:
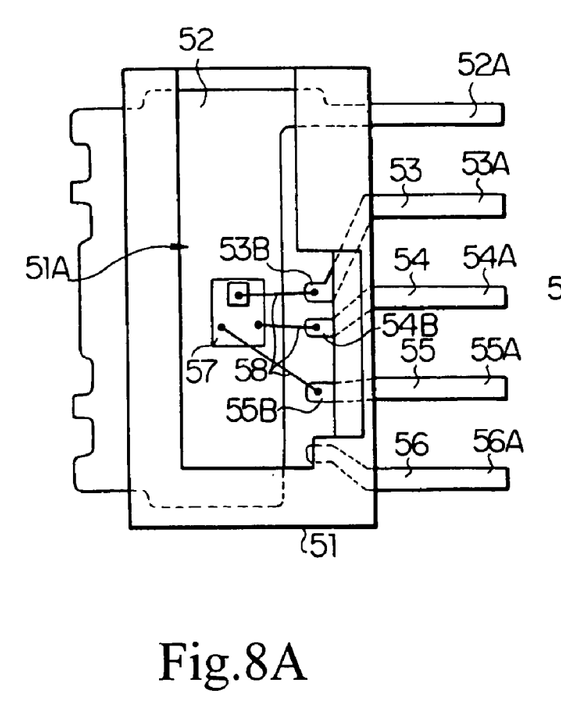
FIG. 8A to FIG. 8C are charts showing another configuration to perform sharing of parts in the conventional semiconductor laser apparatus.
Figure 8B:
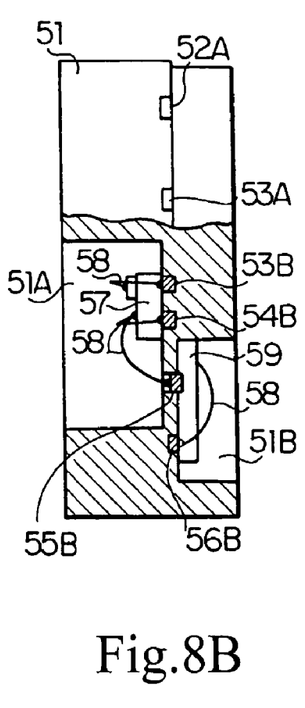
Figure 8C:
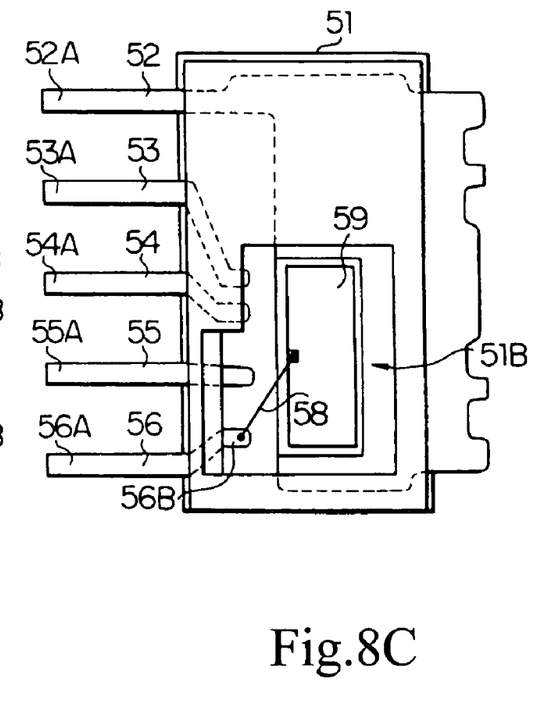

Also, as another means, for example, as shown in FIG. 8A to FIG. 8C, the pad portion 55B of the lead 55 is considered to be exposed to both of the one surface side and the other surface side of the housing 51. Specifically, a thin-walled portion is formed inside the housing 51, and the pad portion 55B of the lead 55 is exposed to this thin-walled portion. However, in this case, at the time of the executing the wire bonding, when a capillary is used to apply a force to the pad portion 55B of the lead 55, the pad portion 55B is pushed by this pressing force and stripped off from the thin-walled portion of the housing 51. Thus, another problem is induced.

SUMMARY OF THE INVENTION

A semiconductor apparatus according to the present invention includes a housing in which device mounting portions are respectively formed on both one surface side and the other surface side thereof, a first device mounted in the device mounting portion on one surface side of this housing, a second device mounted in the device mounting portion on the other surface side of the housing, and a plurality of leads having pad portions for wire bonding, supported by the housing while exposing those pad portions to the device mounting portions, and connected through wires to the first device or second device in the device mounting portions, wherein the pad portions of at least one lead among the plurality of leads are exposed to the device mounting portions in the position relation alternate with each other on the one surface side and the other surface side of the housing, and this exposed portion serves as the connection portion of the wire bonding.

In the semiconductor apparatus of the above-mentioned configuration, the pad portions of at least one lead among the plurality of leads are exposed to the device mounting portions in the position relation alternate with each other, on the one surface side and the other surface side of the housing, and this exposed portion serves as the connection portion of the wire bonding. Thus, the exposed portion of the pad portion on the one surface side of the housing is supported by the housing on the other surface side of the housing, and the exposed portion of the pad portion on the other surface side of the housing is supported by the housing on the one surface side of the housing. Hence, the wire bonding can be suitably performed from any of the one surface side and the other surface side of the housing, on the pad portions of this lead.

DETAILED DESCRIPTION OF THE PRESENTLY PREFERRED EMBODIMENTS

An embodiment of the present invention in a case of an application to a semiconductor laser apparatus, for example, for a bar code reader will be described below in detail with reference to the drawings.

Figure 1A:
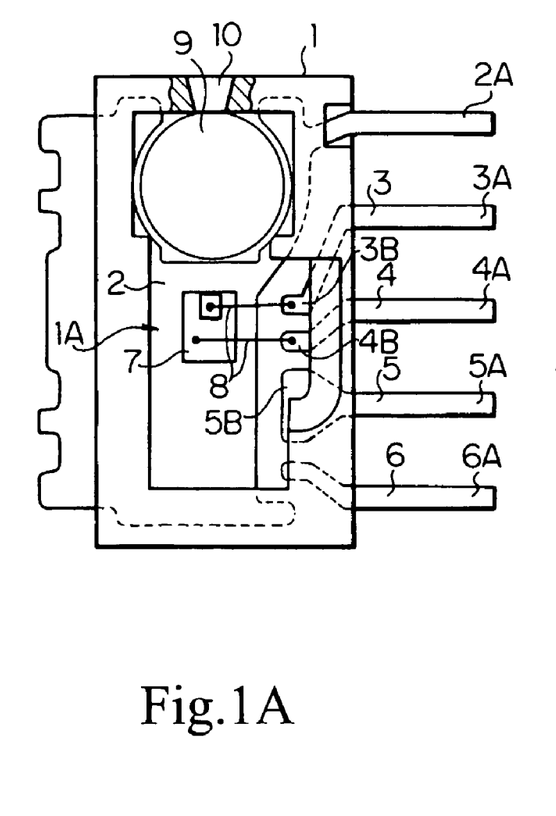
FIG. 1A to FIG. 1C are charts showing a configuration of a semiconductor laser apparatus according to an embodiment of the present invention.
Figures 1B, 1C:
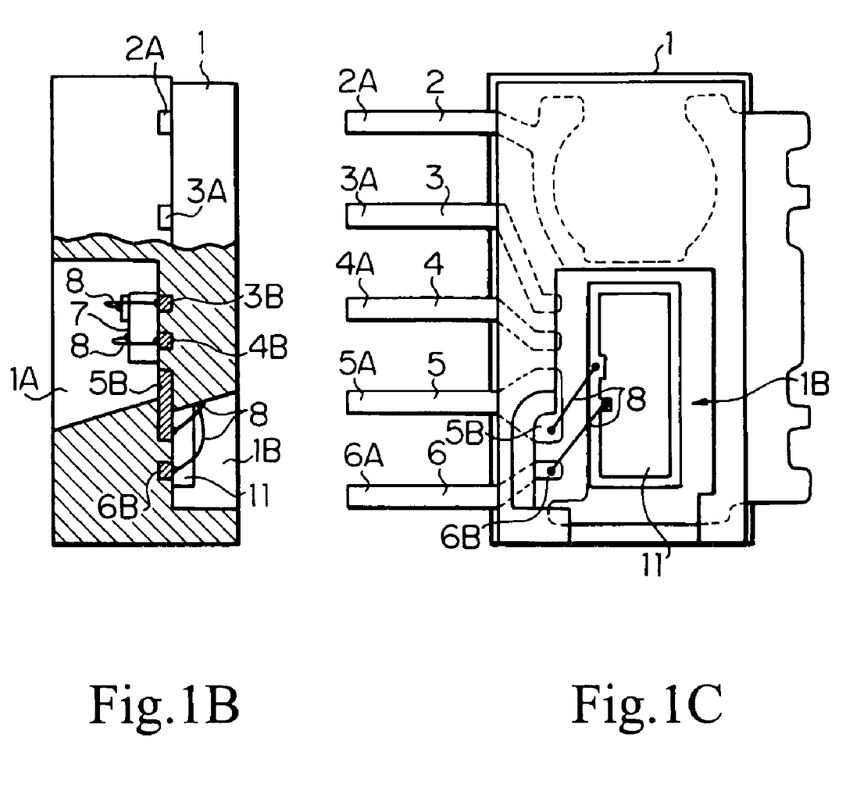

FIG. 1A to FIG. 1C are views showing the configuration of the semiconductor laser apparatus according to the embodiment of the present invention. FIG. 1A is a view when the semiconductor laser apparatus is viewed from one direction, FIG. 1B is a side view including a partially ruptured surface of the semiconductor laser apparatus, and FIG. 1C is a view when the semiconductor laser apparatus is viewed from the other direction. The shown semiconductor laser apparatus is constituted such that a housing 1, which is made of insulating material, for example, such as resin and the like, and approximately rectangular when it is viewed from a flat surface, is used as a base member. A plurality of (five in the shown example) leads 2, 3, 4, 5 and 6 are adhered to the housing 1 serving as the base member, for example, by insert molding. The respective leads 2 to 6 are the plate members made of conductive material, for example, such as phosphor bronze and the like, and electrically insulated from each other by the housing 1. Also, one end sides of the respective leads 2 to 6 are exposed to outside in the situation protruded from the one side of the housing 1, and the protruded lead portions are formed as terminal portions 2A to 6A to connect a drive circuit. Moreover, the other end portions of the other leads 3 to 6 except the lead 2 are formed as pad portions 3B to 6B for wire bonding.

Also, a concave device mounting portion 1A is formed on one surface side of the housing 1, and a semiconductor laser device 7 is mounted on the surface of the lead 2, in the bottom of this device mounting portion 1A. This semiconductor laser device 7 is the semiconductor device called the LOP (Laser Diode On Photodiode) and has the configuration that enables the monitoring the magnitude of laser light outputted from a laser diode in the device by a photo-diode (hereafter, referred to as a monitoring photo-diode) in the same device. The semiconductor laser device 7 corresponds to, for example, a first device in the present invention, and is adhered to the one surface of the lead 2 by using the conductive paste, such as silver paste and the like. Moreover, the semiconductor laser device 7 is connected (wired) to the pad portions 3B and 4B of the leads 3 and 4 by the wire bonding in which wires 8 such as gold lines or the like are used. Consequently, the semiconductor laser device 7 is electrically connected to the lead 2 by the conductive paste and also electrically connected through the wires 8 to the leads 3 and 4. By the way, the first device may be a semiconductor device other than the semiconductor laser.

Also, a condenser lens 9 for collecting the laser light emitted from the semiconductor laser device 7 is assembled in the housing 1. The condenser lens 9 has the spherical structure and is adhered by an adhesive onto a non-penetrating lens positioning hole (not shown) formed in the housing 1. Moreover, an opening 10 located near the condenser lens 9 is formed in the housing 1. The opening 10 is intended to pass the laser light collected by the condenser lens 9. The laser light is irradiated through this opening 10 to a subject (a bar code and the like).

On the other hand, a concave device mounting portion 1B is also formed on the other surface of the housing 1, and a photo-diode 11 is mounted on the surface of the lead 2 and on the bottom of this device mounting portion 1B. This photo-diode 11 corresponds to, for example, a second device in the present invention and is adhered to the other surface (the surface opposite to the mounting surface of the semiconductor laser device 7) of the lead 2 by using insulating paste. Also, the photo-diode 11 is connected (wired) to the pad portions 5B and 6B of the leads 5 and 6 by the wire bonding in which the wires 8 are used. Consequently, the photo-diode 11 is electrically connected through the wires 8 to the leads 5 and 6. By the way, the second device may be a device part other than the photo-diode.

Here, in the device mounting portion 1A formed on the one surface side of the housing 1, the pad portions 3B, 4B and 5B of the leads 3, 4 and 5 are arranged in the situation exposed to the device mounting portion 1A, respectively. Also, in the device mounting portion 1B formed on the other surface side of the housing 1, the pad portions 5B and 6B of the leads 5 and 6 are arranged in the situation exposed to the device mounting portion 1B, respectively. Among them, the pad portion 5B of the lead 5 is arranged in the situation exposed to both of the device mounting portion 1A on the one surface side of the housing 1 and the device mounting portion 1B on the other surface side.

As further detailed, the pad portion 5B of the lead 5 is formed larger than the pad portions 3B, 4B and 6B of the other leads 3, 4 and 6. In particular, the width dimension of the pad portion 5B in the terminal array direction of the lead is set to be several times (about 4 times in the shown example) the width dimensions of the other pad portions 3B, 4B and 6B. Also, the pad portions 3B and 4B of the leads 3 and 4 are in the situation embedded in the housing 1 except the pad surface exposed to the device mounting portion 1A, and the pad portion 6B of the lead 6 is in the situation embedded in the housing 1 except the pad surface exposed to the device mounting portion 1B.

On the contrary, the pad portion 5B of the lead 5 is in the situation that the substantial half of the pad surface is exposed in the device mounting portion 1A on the one surface side of the housing 1 and that the substantial half of the pad surface is also exposed in the device mounting portion 1B. However, the exposed portion of the pad 5B on one surface side of the housing 1 and the exposed portion of the pad portion 5B on the other surface side of the housing 1 are in the position relation different from each other, and thus are not coincident. That is, the pad portion 5B of the lead 5 has a portion of one side exposed to the device mounting portion 1A and a non-coincident portion on the other side exposed to the device mounting portion 1B in the position relation alternate with each other, on the one surface side and other surface side of the housing 1, and these exposed portions can serve as the connection portion for wire bonding.

Figure 2A:
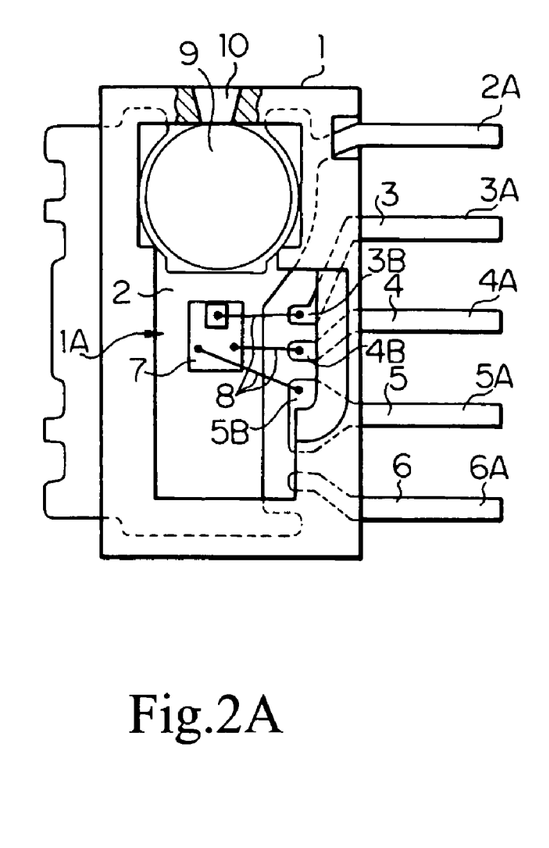
FIG. 2A to FIG. 2C are charts showing another configuration of the semiconductor laser apparatus according to the embodiment of the present invention.
Figure 2B:
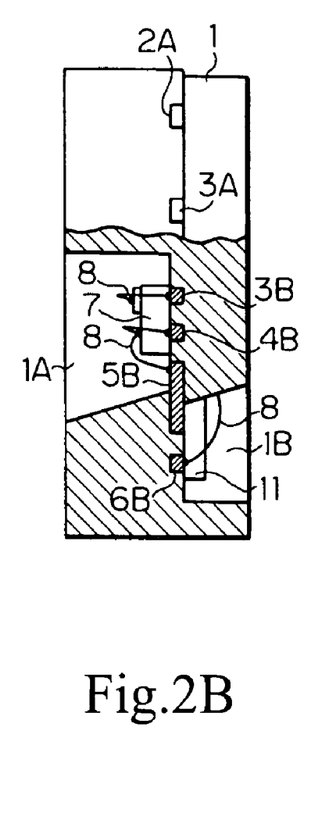
Figure 2C:
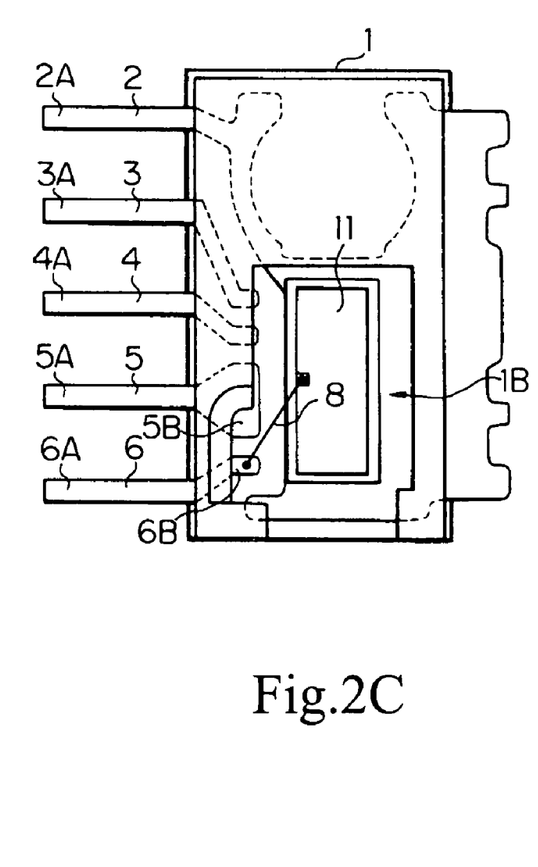

Since the pad portion 5B of the lead 5 is arranged as mentioned above, the exposed portion of the pad portion 5B on the one surface side of the housing 1 is supported by the housing 1 on other surface side of the housing 1, and the exposed portion of the pad portion 5B on other surface side of the housing 1 is supported by the housing 1 on the one surface side of the housing 1. Thus, as previously shown in FIG. 1A to FIG. 1C, when the photo-diode 11 is connected through the wires 8 to the pad portion 5B of the lead 5, at the time of the wire bonding, the pressing force of the capillary applied to the pad portion 5B is received by the housing 1. Also, as shown in FIG. 2A to FIG. 2C, when the semiconductor laser device 7 is connected through the wire 8 to the pad portion 5B of the lead 5, at the time of the wire bonding, the pressing force of the capillary applied to the pad portion 5B is received by the housing 1. In short, even if the wire bonding is carried out from any of the one surface side and other surface side of the housing 1, in the situation that the pad portion 5B of the lead 5 is supported by the housing 1, one end of the wire 8 can be connected to the exposed portion of the pad portion 5B.

Thus, without any strip of the pad portion 5B from the housing 1 and without any deterioration in the reliability of the connection, the wire bonding can be performed from any of the one surface side and other surface side of the housing 1, on the pad portion 5B of the lead 5. As a result, even if the configuration of the electric circuit including the semiconductor laser device 7 and the photo-diode 11 is different, the housing 1 and the leads 2 to 6 can be treated as the common part. Also, it is not necessary to increase the number of the leads. Thus, it is possible to make the parts common without making the scale of the apparatus larger.

Figure 3:
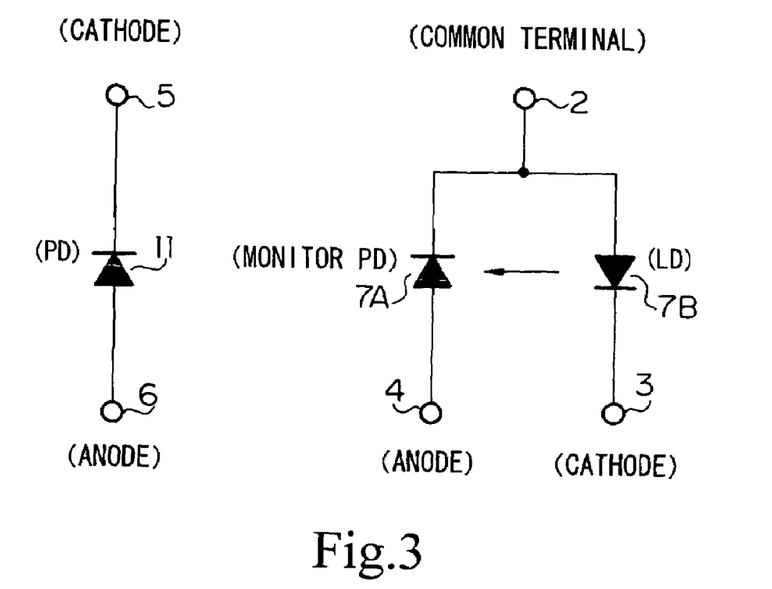
FIG. 3 is a chart showing a circuit configuration of the semiconductor laser apparatus.

As the concrete circuit configuration of the semiconductor laser apparatus, for example, the electric circuit shown in FIG. 3 is attained by the semiconductor laser apparatus previously shown in FIG. 1A to FIG. 1C. This electric circuit is configured such that the photo-diode 11 for receiving the light is connected to the lead 5 serving as a cathode terminal and the lead 6 serving as an anode terminal, a monitoring photo-diode 7A of the semiconductor laser device 7 is connected to the lead 2 serving as a common terminal and the lead 4 serving as an anode terminal, and a laser diode 7B of the semiconductor laser device 7 is connected to the lead 2 serving as the common terminal and the lead 3 serving as a cathode terminal.

Figure 4:
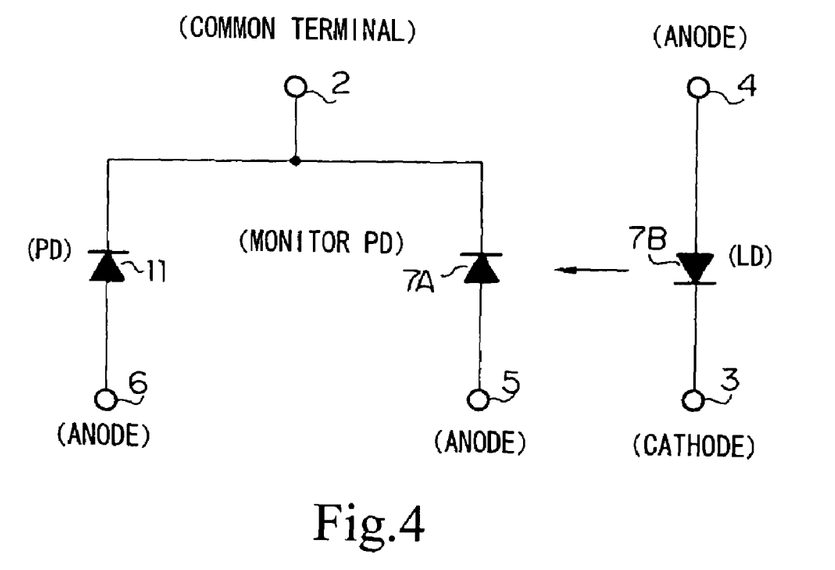
FIG. 4 is a chart showing another circuit configuration of the semiconductor laser apparatus.

On the other hand, the electric circuit shown in FIG. 4 is attained by the semiconductor laser apparatus previously shown in FIG. 2A to FIG. 2C. This electric circuit is configured such that the photo-diode 11 for receiving the light is connected to the lead 2 serving as the common terminal and the lead 6 serving as the anode terminal, the monitoring photo-diode 7A of the semiconductor laser device 7 is connected to the lead 2 serving as the common terminal and the lead 5 serving as the anode terminal, and the laser diode 7B of the semiconductor laser device 7 is connected to the lead 3 serving as the cathode terminal and the lead 4 serving as the anode terminal. In particular, in the case of employing this circuit configuration, the monitoring photo-diode 7A and laser diode 7B of the semiconductor laser device 7 are separated, and the monitoring photo-diode 7A and the photo-diode 11 for receiving the light are connected through the common terminal. Thus, since the voltage different from the laser diode 7A can be applied to the monitoring photo-diode 7A, the sensibility of both of the photo-diodes 7B and 11 can be increased.

Also, in the semiconductor laser apparatus according to the present invention, the pad portion 5B of the lead 5 is formed larger than the pad portions 3B, 4B and 6B of the other leads 3, 4 and 6. Thus, when the wire bonding is actually performed on the pad portion 5B of the lead 5, on the one surface side and the other surface side of the housing 1, the respective connection portions for the wire bonding can be reserved at the sizes equal to or larger than the pad portions 3B, 4B and 6B of the other leads 3, 4 and 6.

By the way, in the above-mentioned embodiment, the application example to the semiconductor laser apparatus has been explained. However, the present invention can be applied to even a semiconductor apparatus other than the semiconductor laser apparatus. Also, the configuration including a plurality of leads similar to the above-mentioned lead 5 can be designed.

As mentioned above, according to the semiconductor apparatus in the present invention, among the plurality of leads, the pad portions of at least one lead are exposed to the device mounting portions in the position relation alternate with each other, on the one surface side and the other surface side of the housing, and this exposed portion serves as the connection portion of the wire bonding. Thus, the wire bonding can be suitably performed from any of the one surface side and the other surface side of the housing, on the pad portions of this lead. Consequently, the free degree of the wire bonding is increased, which enables the parts (especially, the housing, the lead and the like) to be made common, in coping with the various electric circuits.

The invention claimed is:

1. A semiconductor apparatus comprising:
    a housing in which device mounting portions are respectively formed on both one surface side and another surface side thereof;
    a first device mounted in the device mounting portion on the one surface side of the housing;
    a second device mounted in the device mounting portion on the other surface side of the housing; and
    a plurality of leads having wire bonding pad portions, supported by the housing while exposing those pad portions to the device mounting portions, and connected via wires to the first device or second device portions,
    wherein,
    first and second exposed areas of said pad portion of at least one lead among the plurality of leads are exposed to the device mounting portions such that a pad portion area exposed on the one surface side is not coincident with a pad portion area exposed on the other surface side and is supported by the housing covering the unexposed area of the opposite side of the pad portion, and at least one of the exposed areas serves as a wire bonding pad.

2. The semiconductor apparatus as claimed in claim 1, wherein:

said pad portion of said least one lead is larger than the pad portions of the other leads.

3. A semiconductor apparatus characterized by comprising:

a housing with respective device mounting portions on one surface side and another surface side;

a first device mounted in the device mounting portion on said one surface side of the housing;

a second device mounted in the device mounting portion on said the other surface side of the housing; and a plurality of leads having wire bonding pad portions supported by the housing while exposing those pad portions to the device mounting portions, and being connected via wires to the first device or second device in the device mounting portions, wherein, first and second exposed areas of the pad portion of at least one lead among the plurality of leads are exposed to the device mounting portions in a position relation alternate with each other such that the first and second exposed areas are not coincident with each other and is supported by the housing covering the unexposed area of the opposite side of the pad portion, and the first exposed area is wire bonded to the first device and the second exposed area is wire bonded to the second device.

4. The semiconductor apparatus as claimed in claim 3, wherein, said pad portion of said least one lead is larger in than the pad portions of the other leads.

* * * * *